(12) United States Patent
Usami (10) Patent No.: US 6,319,797 B1
(45) Date of Patent: Nov. 20, 2001

(54) PROCESS FOR MANUFACTURING A SEMICONDUCTOR DEVICE (75) Inventor: Tatsuya Usami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/469,030

(22) Filed: Dec. 21, 1999

(30) Foreign Application Priority Data

Dec. 28, 1998 (JP) .................................................. 10-374172

(51) Int. Cl.⁷ .................................................. H01L 21/425
(52) U.S. Cl. ......................... 438/510; 438/704; 438/735
(58) Field of Search .................................. 438/689, 700, 438/704, 705, 710, 750, 766, 738, 787, 782, 624, 781, 622, 623, 783, 788, 510, 735; 427/569, 120, 387; 257/758

(56) References Cited

U.S. PATENT DOCUMENTS

| | | | |
|---|---|---|---|
| 5,414,221 | * 5/1995 | Gardner | 174/261 |
| 5,750,403 | * 5/1998 | Inoue et al. | 438/787 |
| 5,856,706 | * 1/1999 | Lee | 257/758 |
| 5,872,066 | * 2/1999 | Fang et al. | 438/787 |
| 5,877,092 | * 3/1999 | Lee et al. | 438/738 |
| 5,935,876 | * 8/1999 | Lee et al. | 438/738 |
| 6,057,245 | * 5/2000 | Annapragada et al. | 438/706 |
| 6,077,730 | * 6/2000 | Lee et al. | 438/149 |

FOREIGN PATENT DOCUMENTS

| | | | |
|---|---|---|---|
| 10-242278 | 9/1998 | (JP) | H01L/21/768 |
| 10-247686 | 9/1998 | (JP) | H01L/21/768 |
| 10-270447 | 9/1998 | (JP) | H01L/21/3205 |

OTHER PUBLICATIONS

Stanley Wolf and Richard N. Tauber, Silicon Processing for the VLSI Era vol. 1: Process Technology, 1986, Lattice Press, p. 168–169.*
C. Y. Chang and S. M. Sze, ULSI Tecnology, 1996, McGraw–Hill Companies, Inc., p. 419–421.*
"Effect of Curing Atomosopher on Characteristics of SOG with Si–H Bonds" YKawano et al 42th Applied Physics Joint Lectures; proceedings No. 2 Spring 1995 Summary 30A–C–5.

* cited by examiner

Primary Examiner—Matthew Smith
Assistant Examiner—Calvin Lee
(74) Attorney, Agent, or Firm—Hayes, Soloway, Hennessey, Grossman & Hage, PC (57) ABSTRACT An HSQ film 4 is formed on a silicon oxide film 1 and the film 4 is subject to $B_2H_6$ plasma irradiation, to form a boron-implanted region 5. After forming a plasma TEOS film 6 on the region, a concave 8 is formed with a hydrofluoric acid-containing etchant, while wet-etching is stopped on the boron-implanted region 5. Then, the exposed HSQ film 4 in the bottom of the concave 8 is dry-etched to form a contact hole 9 reaching an Al interconnection 2. Then, the contact hole 9 is filled with an upper interconnection material to provide a multilayered interconnection structure.

24 Claims, 6 Drawing Sheets

PROCESS FOR MANUFACTURING A SEMICONDUCTOR DEVICE

BACKGROUND OF THE INVENTION

1. Field of the Invention

This invention relates to a process for manufacturing a semiconductor device comprising the step of wet-etching the upper film in a multilayer film consisting of different materials. In particular, it relates to a process for manufacturing a semiconductor device comprising the step of, e.g., wet-etching an interlayer insulating film having a multilayer structure consisting of different materials to form a contact hole.

2. Description of the Related Art

Recent miniaturization of semiconductor devices has increasingly required a higher level of fine processing technology, in which a flattening process is significantly important for exposure or fine processing techniques. Insufficient flatness may cause defocus in exposure, loading to not only difficulty in processing a photoresist but also frequent generation of non-etched areas in an etching process using the photoresist as a mask. A technique employing an SOG (Spin On Glass) interlayer film is a promising flattening procedure. An HSQ (Hydrogen Silisesquioxane) film, an SOG in which a metal connecting area may be exposed (i.e., etching-back is not necessary), has been frequently used as a material achieving both reduction in the number of production steps and flattening.

Figure 4:
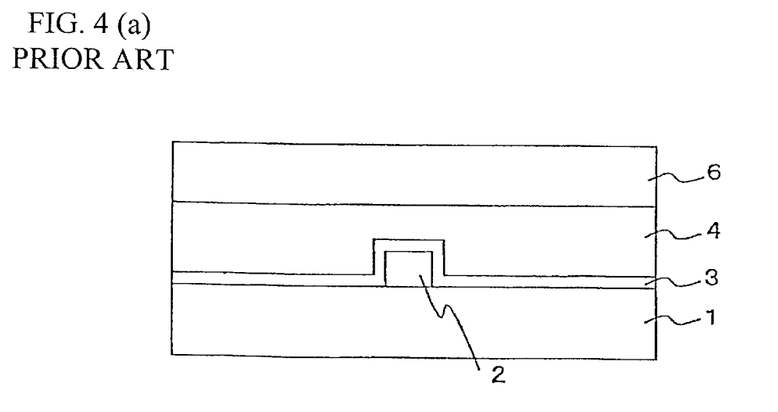
FIG. 4(a)–4(b) illustrate the first part of a process cross-section showing a process for manufacturing a semiconductor device according to the prior art.

A conventional manufacturing process for a multilayered interconnection structure using an HSQ film will be described with reference to FIGS. 4 and 5.

First, an interconnection layer is formed as outlined in FIG. 4(a). On a semiconductor substrate (unshown) is formed a silicon oxide film 1, on which is then formed an Al interconnection 2. Over the whole surface are sequentially formed a plasma TEOS (Tetra-Ethyl-Oxy-Silane) oxide film 3 (thickness: 100 nm), an HSQ film 4 (thickness: 500 nm) and a plasma TEOS oxide film 6 (thickness: 200 nm) (FIG. 4(a)). Then, on the surface is formed a mask 7 having an opening. The surface is then wet-etched via the mask 7 with hydrofluoric acid to form a contact hole 9 reaching the Al interconnection 2 is (FIG. 4(b)).

Figure 5:
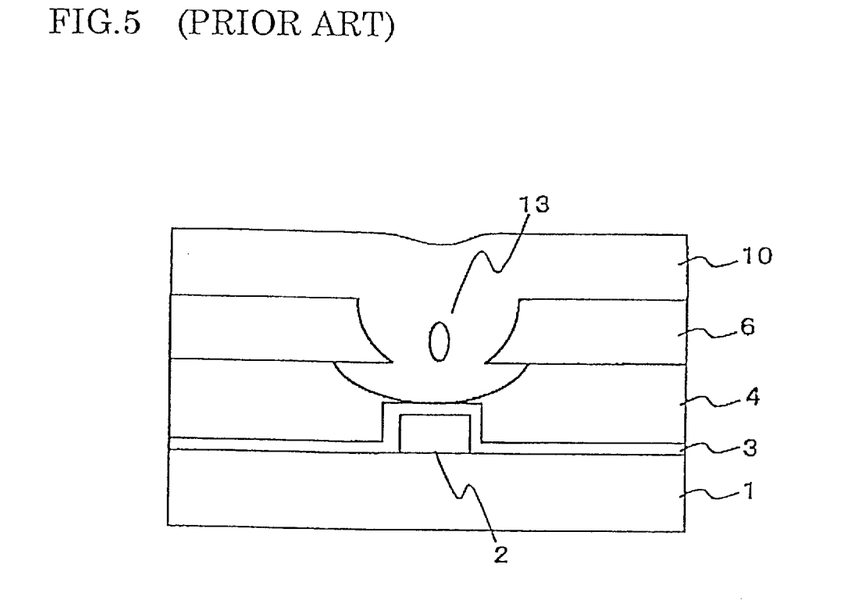
FIG. 5 is the second part of the process cross-section showing another process for manufacturing a semiconductor device according to the prior art.

The contact hole is filled with an Al film 10, which is then patterned to form an upper interconnection to provide a multilayered interconnection structure (FIG. 5).

As described above, the prior art provides a multilayered interconnection structure by forming the HSQ film 4 and the plasma TEOS film 6, wet-etching the plasma TEOS film 6 and dry-etching the HSQ film 4 to form the contact hole. The plasma TEOS film is formed on the HSQ film 4 because (i) the HSQ film 4 is less resistant to oxygen plasma ashing during mask stripping or resist stripping, and (ii) the HSQ film is insufficiently adhered to the upper Al interconnection layer. On the other hand, the plasma TEOS film 6 is wet-etched because a sectionally cup-shaped concave is formed by side etching (see, e.g., FIG. 3). When forming an interconnection layer is formed with a metal requiring reflow such as Al, such a cup-shape may suitably facilitate reflow, leading to an interconnection layer exhibiting good properties.

However, in the prior art, the side of the HSQ film 4 is etched to form a cavity 15 because the HSQ film 4 is etched by an etchant such as BHF several times as fast as the plasma TEOS oxide film 6. Such a cavity may cause a void 13 during the subsequent step of filling with an Al film (FIG. 5).

Such a problem may also occur, besides the HSQ film, in, e.g., an SOG film.

To avoid the above problem, modifying the surface of the base film has been investigated for improving its resistance to wet-etching to prevent cavity formation. JP-A 4-116825 has disclosed that an SOG film surface is cured by irradiation with hydrogen plasma and then heating to improve its resistance to HF etching. In the technique, hydrogen radicals are incorporated into the SOG film by exposure to hydrogen plasma. The hydrogen radicals can attract inreacted OHs and Hs or OHs and thus make them leave the SOG, facilitating polymerization of the SOG during the subsequent heating process.

Figure 6:
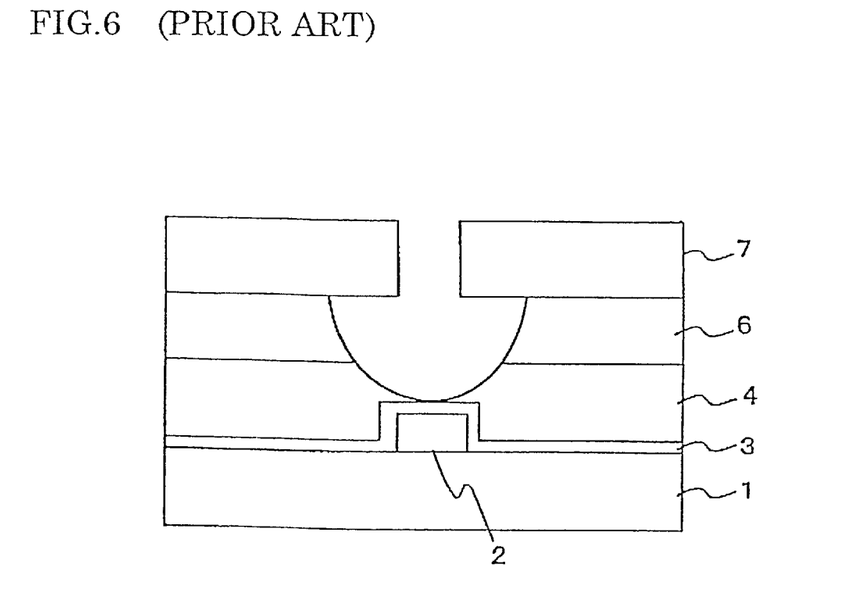
FIG. 6 is a process cross-section showing another process for manufacturing a semiconductor device according to the prior art.

However, the technique still has a room for improvement that the SOG cannot be resistant to etching higher than a common $SiO_2$ film. Specifically, the above technique facilitates polymerization by attracting unreacted OH or H or OH present in the SOG, i.e., allows the SOG to have a film structure similar to a common $SiO_2$ film. In other words, if hydrogen plasma irradiation is most effective to adequately cure the surface, an $SiO_2$ film is formed on the SOG surface. The technique may improve resistance to etching, but has a restriction that it cannot permit the surface to be more resistant than $SiO_2$. The above process aims to achieve etching resistance of the lower SOG film equivalent to that of the upper $SiO_2$ film, for preventing a cavity. It can prevent cavity formation in the lower layer to some extent. Wet-etching is, however, not stopped on the surface of the lower layer, so that the contact hole tends to be generally extended, i.e., cup-shaped, as shown in FIG. 6. In other words, the diameter of the contact hole tends to be larger than a designed value. Such a shape may cause current leak or parasitic capacitance between adjacent interconnections (unshown), leading to a semiconductor device having poor properties. The problem may be particularly significant for a more refined device.

Summary 30a-C-5 in the proceeding No. 2 for 42th Applied Physics Joint Lectures (Japan, spring, 1995) has described that curing in an oxygen-containing atmosphere may reduce an HF etching rate for an SOG film comprising SiH. However, as in the case of the technique described in the above patent application, the process improves etching resistance by converting Si—H into Si—O, and thus cannot achieve wet-etching resistance higher than that in $SiO_2$. That is, this process also aims to provide an SOG film structure similar to an $SiO_2$ film, and therefore, has a limitation in improving HF etching resistance.

Figure 7:
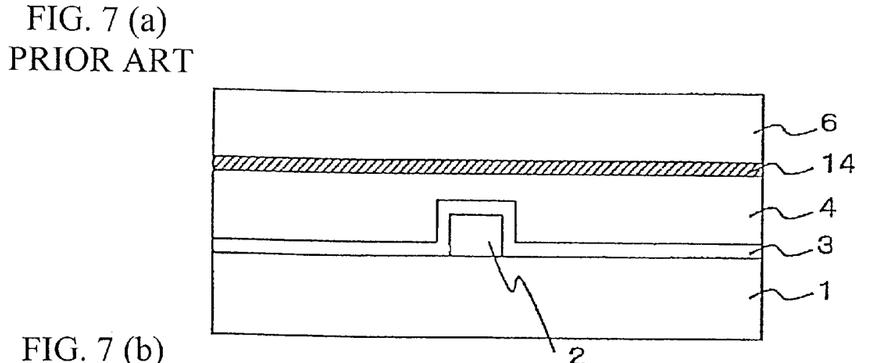
FIG. 7(a)–7(c) illustrate a process cross-section showing another process for manufacturing a semiconductor device according to the prior art.

To solve the above problems, it has been proposed to form an etching stopper film between the upper film and the base film. FIG. 7 shows a process in which an SiN film is formed as an etching stopper film.

This process will be described with reference to FIG. 7. On a substrate is formed an Al interconnection 2, on which are sequentially formed a plasma TEOS oxide film 3 (thickness: 100 nm), an HSQ film 4 (thickness: 500 nm) and an SiN film 14 (thickness: 50 nm) by CVD. Then, over the surface is formed a plasma TEOS oxide film 6 (thickness: 200 nm) (FIG. 7(a)).

Then, using a mask 7, it is wet-etched with buffered hydrofluoric acid. Since the SiN film 14 is much more resistant to etching with buffered hydrofluoric acid than the plasma TEOS oxide film 6, etching is terminated on the upper surface of the SiN film 14 as shown in FIG. 7(b). The product is dry-etched to form a contact hole 9 reaching an interconnection layer 2 (FIG. 7(c)).

This process, however, may form a roof 15 as shown FIG. 7(c) due to difference in a dry-etching rate between the SiN film 14 and the HSQ film 4. Such a roof may cause problems such as a void during filling the contact hole with an upper-interconnection material and disconnection of the upper interconnection.

Furthermore, the HSQ film 4 is poorly adhered to the SiN film 14, frequently leading to peeling 16 in the interface between them. Peeling may occur not only in the wall of the contact hole but also in other areas. Then, cracks may be formed from such peeling.

The case in which a silicon nitride film is used as a stopper film has been described. However, even when using other materials, similar problems may, whenever a stopper film is deposited, occur.

SUMMARY OF THE INVENTION

In the light of the above situation, an objective of this invention is to provide a method for effectively preventing etching of the lower films in a multilayer film consisting of different materials during wet-etching its upper film, without forming an etching stopper film. A specific objective of this invention is to provide a method for effectively preventing etching of the lower films during wet-etching the upper film, without forming an etching stopper film in the step of forming a contact hole in a multilayered interlayer insulating film consisting of different materials.

This invention provides a process for manufacturing a semiconductor device, comprising the steps of forming the first and the second films on a semiconductor substrate and then wet-etching the second film with an etchant wherein the first film has a higher etching rate to the etchant than that of the second film; after forming the first film, boron being implanted in its surface before forming the second film.

In the process for manufacturing a semiconductor device, after forming the first film, boron is implanted in its surface, which is effective for improving wet-etching resistance of the first film surface. Thus, the first film surface can act as an etching stopper during wet-etching of the second film to effectively prevent the first film from being etched or deteriorated with the etchant.

This invention also provides a process for manufacturing a semiconductor device, comprising the steps of:
  forming a lower interconnection on a semiconductor substrate;
  forming an interlayer insulating film in which the first and the second films are sequentially deposited, on the surface;
  wet-etching a given area of the second film with an etchant to expose the first film;
  dry-etching the exposed first film to form a contact hole reaching the lower interconnection; and
  forming an upper interconnection layer which fills the contact hole;
  wherein the first film has a higher etching rate to the etchant than that of the second film,
  after forming the first film, boron being implanted in its surface before forming the second film.

In the process for manufacturing a semiconductor device, implantation of boron in the surface of the first film is effective for improving wet-etching resistance of the first film surface. Thus, the first film surface can act as an etching stopper during wet-etching of the second film to effectively prevent the first film from being etched or deteriorated with the etchant. Thus, a desired shape of contact hole can be formed without deteriorating the properties of the interlayer insulating film, and therefore, problems such as insufficient filling with the upper interconnection can be solved.

This invention also provides process for manufacturing a semiconductor device comprising the steps of:
  forming a lower interconnection on a semiconductor substrate;
  forming an interlayer insulating film in which the first and the second films are sequentially deposited, on the surface;
  wet-etching a given area of the second film with an etchant to form a sectionally cup-shaped concave in the bottom of which the first film is exposed;
  dry-etching the exposed first film to form a contact hole reaching the lower interconnection;
  forming an upper interconnection layer which fills the contact hole; and
  making the upper interconnection reflow by heating,
  wherein the first film has a higher etching rate to the etchant than that of the second film,
  after forming the first film, boron being implanted in its surface before forming the second film.

In the process for manufacturing a semiconductor device, implantation of boron is effective for improving wet-etching resistance of the first film surface. Thus, the first film surface can act as an etching stopper during wet-etching of the second film to effectively prevent the first film from being etched or deteriorated with the etchant. Thus a desired shape of contact hole can be formed without deteriorating the properties of the interlayer insulating film, and therefore, problems such as insufficient filling with the upper interconnection can be solved. Furthermore, the sectionally cup-shaped concave can be formed as designed, leading to suitable reflow of the upper interconnection. Thus, there can be provided a lower-resistance multilayered interconnection structure exhibiting good properties.

Figure 3:
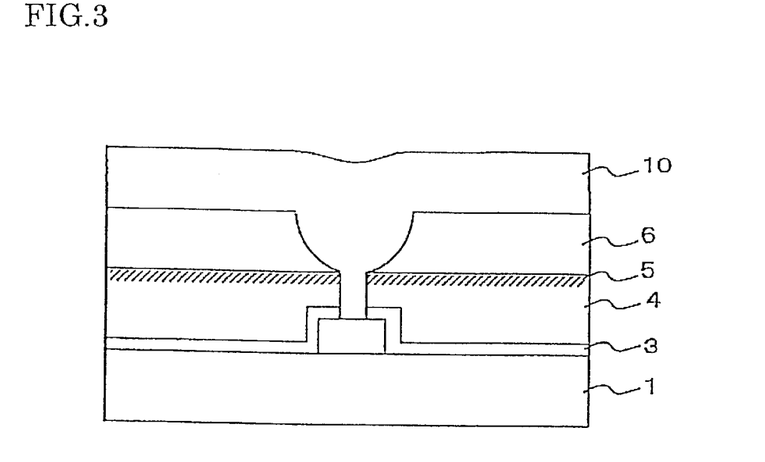
FIG. 3 is the third part of the process cross-section showing another process for manufacturing a semiconductor device according to this invention.

An ideal contact hole is shown in FIG. 3 where it is preferable that only the hole of the second film (plasma TEOS film 6) is sectionally cup-shaped concave and a cylindrical narrower hole is formed in the first film (HSQ film 4). The prior art cannot provide such an ideal shape, while the process for manufacturing a semiconductor device of this invention can readily achieve the shape. Such a sectionally cup-shaped concave allows reflow to be suitable and an interconnection layer to have good properties. In the process of this invention, an extent of side etching can be precisely controlled to form a cup shape having a designed extent. It can sufficiently eliminate current leak and crosstalk for improving reliability of the device.

This invention also provides a laminate in which the first and the second films are sequentially formed on a semiconductor substrate wherein the first film has a higher etching rate to a hydrofluoric (HF) acid-containing etchant than that of the second film; the surface of the first film being modified by implanting boron.

In the laminate, the surface of the first film is modified by implanting boron for improving resistance to the HF-containing etchant. The surface, therefore, acts as an etching stopper during wet-etching the second film with the HF-containing etchant. It can effectively prevent the first film from being etched or deteriorated with the etchant. Using such a laminate permits a variety of semiconductor devices on whose first film a concave is formed with an HF-containing etchant to be suitably prepared.

This invention is characterized in implanting boron for improving wet-etching resistance of a film. The mechanism of improving wet-etching resistance by boron implantation is not fully understood, and it may be caused by some change in the film structure due to boron implantation. A presumable mechanism for improvement in wet-etching resistance will be described for a case where boron is implanted in an HSQ film.

Formula (1) is the structure of the HSQ film.

formula (1)

When boron is implanted in the HSQ film by, e.g., plasma irradiation, weak Si—H bonds are readily cleaved to provide internal unbound oxygens and Si—O bonds. Then, the Si—O bonds are probably bound to implanted boron to give a modified structure of Formula (2).

formula (2)

Thus, weak Si—H bonds may be converted into Si—O—BH$_2$s highly resistant to an etchant, leading to improvement in wet-etching resistance. Here, change in the structure induced by boron may occur near the surface of the HSQ film while the structure of Formula (1) is maintained in the inside of the HSQ film. Wet-etching resistance can, therefore, be improved without deteriorating the properties of the HSQ film.

On the other hand, in the technique described in JP-A 4-116825, the film structure of an SOG film is changed into that of Formula (3) by irradiating hydrogen plasma.

formula (3)

Specifically, Si—O—H bonds are converted into Si—O—bonds, and thus the film structure becomes similar to that of SiO$_2$. Wet-etching resistance may be improved, but in theory, the resistance cannot be higher than that of SiO$_2$. The modified surface cannot, therefore, act as a etching stopper during wet-etching a silicon oxide film. In contrast, the process of this invention converts Si—H bonds into Si—O—BH$_2$s highly resistant to an etchant and thus can achieve higher etching resistance than that of an SiO$_2$ film. The surface can, therefore, act as an etching stopper.

As described above, this invention can improve etching resistance of an HSQ or SOG film by boron implantation; in particular, etching resistance to an HF-containing etchant can be effectively improved. According to our investigation, it has been found that boron is the most effective dopant. For example, implantation of phosphorous failed to improve etching resistance.

As described above, this invention converts by boron implantation a surface into an etching stopper. Alternatively, it may be possible to insert a BSG (Boro Silicate Glass) film as an etching stopper between the first and the second films. Such approach may, however, cause problems such as void formation during filling a via hole with a metal film due to a higher hygroscopicity of the BSG film. A presumable structure for the BSG film is Formula (4) which comprises a B—O—H group. The O—H group contributes to a higher hygroscopicity. The BSG film formed tends to absorb moisture.

formula (4)

For avoiding the problem, it is effective to heat the film to a high temperature of 600 to 700° C. for removing absorbed moisture. Processing at such an elevated temperature damages metal interconnections and therefore, cannot be practically conducted.

Thus, the process of this invention can form a modified film region acting as an etching stopper without forming an additional film as an etching stopper, and therefore, can effectively prevent a base film from being etched.

As described above, according to this invention, boron is implanted in the surface of the first film to improve its wet-etching resistance. The region where boron has been implanted can act as an etching stopper during wet-etching the second film, and therefore, can effectively prevent the above first film as a base film from being etched or deteriorated with an etchant. Thus, a desired shape of contact hole can be formed as designed, leading to improvement in reliability of a device. It is advantageous for miniaturizing a device.

DETAILED DESCRIPTION OF THE PREFERRED EMBODIMENTS

In this invention, both the first and the second films are preferably a silicon oxide based insulating film. A silicon oxide based insulating film refers to a film comprising a structure having —Si—O— bond such as an $SiO_2$, HSQ and SOG films. Such a film can be employed in this invention to achieve a remarkable effect of boron implantation on improving wet-etching resistance. Especially, when the first and the second films are HSQ and silicon oxide or SOG and silicon oxide, respectively, this invention is particularly effective.

An HSQ film has the structure of Formula (1) and a specific dielectric constant of about 3.0. An SOG film may be inorganic or organic. An organic SOG film comprises a silicon oxide film as a base material to which organic groups such as methyl (—$CH_3$) are bound. The higher the content of the organic moieties is, the lower the dielectric constant of the organic SOG film, and a dielectric constant as low as about 2.7 may be achieved.

An HSQ or SOG film has an advantageous property of a lower dielectric constant, while has a defect of poor wet-etching resistance. According to this invention, boron can be implanted in and modify a surface without changing the internal structure of the HSQ or SOG film, and thus can improve its wet-etching resistance. Its wet-etching resistance can be, therefore, improved while maintaining a lower dielectric constant.

When a process for manufacturing a semiconductor device of this invention and a laminate of this invention are applied to a multilayered interconnection structure, an HSQ film is preferably used as the first film. This will be described.

Figure 8:
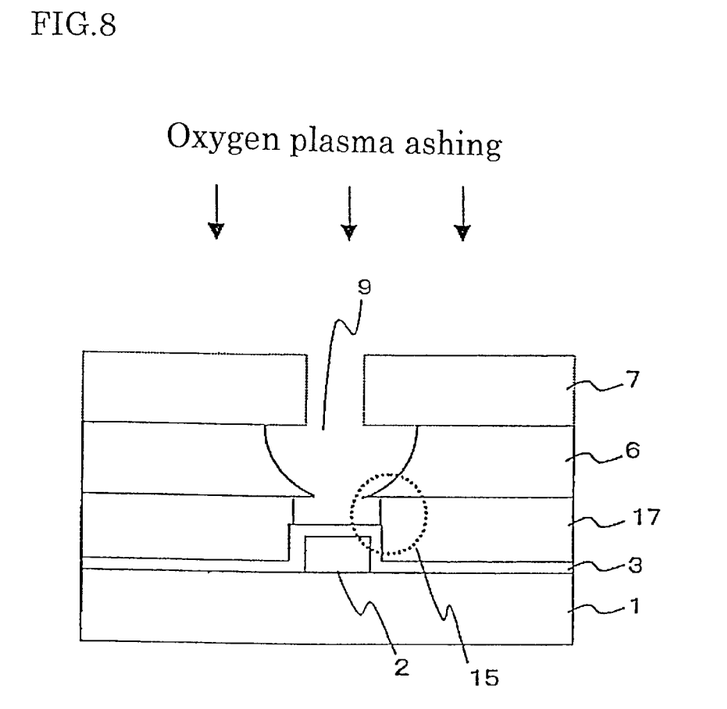
FIG. 8 is a cross-section of an interconnection structure utilizing an organic SOG film.

An organic SOG film has an advantage that it is resistant to cracking and can be formed, as a thick film. The organic SOG film, however, has $CH_3$ groups in its structure. Thus, when it is exposed to $O_2$ ashing during a resist removing step after opening a contact hole, it may be side-etched as shown in FIG. 8, resulting in formation of a cavity 15.

Figure 9:
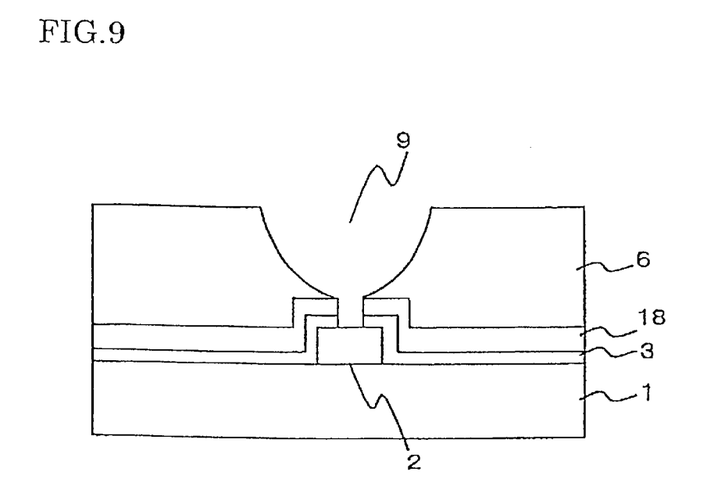
FIG. 9 is a cross-section of an interconnection structure utilizing an inorganic SOG film.

On the other hand, an inorganic SOG film does not comprise organic moieties such as $CH_3$ as in an organic SOG film, and therefore, there may not occur size reduction in a membrane. It is, however, apt to generate cracks, and there is a limitation that it cannot be formed as a thick film. FIG. 9 shows an example of an interconnection structure comprising an inorganic SOG film. Since the inorganic SOG film 18 must be thin, the upper TEOS oxide film 6 becomes relatively thicker and thus, a sectionally cup-shaped concave may become larger. It may be, therefore, difficult to apply an inorganic SOG film to a refined structure.

On the other hand, an HSQ does not generate a cavity during $O_2$ ashing because of absence of organic moieties such as $CH_3$ and is resistant to cracking so that it can be formed as a thick film. Therefore, it can be suitably applied to a refined device. When such an HSQ film is used as the first film, there may often occur in the prior art problems such as the above cavity formation especially due to lower resistance to etching with an HF-containing etchant. According to this invention, these problems can be effectively solved to adequately utilize excellent properties of an HSQ film.

In the process of this invention, for example, an HF-containing etchant may be used for wet-etching. HF-containing etchants which may be used include diluted hydrofluoric acid (DHF), a mixture of hydrofluoric acid-ammonium fluoride solution (buffered hydrofluoric acid; BHF) and a mixture of hydrofluoric acid-hydrogen peroxide solution (FPM).

In this invention, boron is implanted preferably by exposing the first film in a boron plasma atmosphere. This method can implant boron only near the surface of the first film and therefore, can improve wet-etching resistance of the first film without deteriorating its properties.

Alternatively, boron may be implanted by ion implantation to the first film. In the process, an acceleration voltage during implantation may be selected as appropriate, depending on various factors such as subsequent wet-etching conditions, and is generally 2 to 30 keV.

In this invention, a boron-containing layer is formed in the surface of the first film by boron implantation. The boron-containing layer preferably has a thickness of up to 100 nm, more preferably up to 30 nm. Such a thickness allows wet-etching resistance to be improved without deteriorating the properties of the first film. For a lower limit for the thickness, there are no limitations, and it may be generally at least 3 nm.

In this invention, a boron level in the boron-implanted layer is preferably $5 \times 10^{21}$ to $1 \times 10^{23}$ atoms/$cm^3$, more preferably $1 \times 10^{22}$ to $5 \times 10^{22}$ atoms/$cm^3$. Such a level allows wet-etching resistance to be suitably improved without deteriorating the properties of the first film.

Semiconductor substrate which may be used in this invention, include an SOI (Silicon On Insulator) substrate and substrates consisting of a group III–V or II–VI compound semiconductor.

EXAMPLE 1

Figure 1:
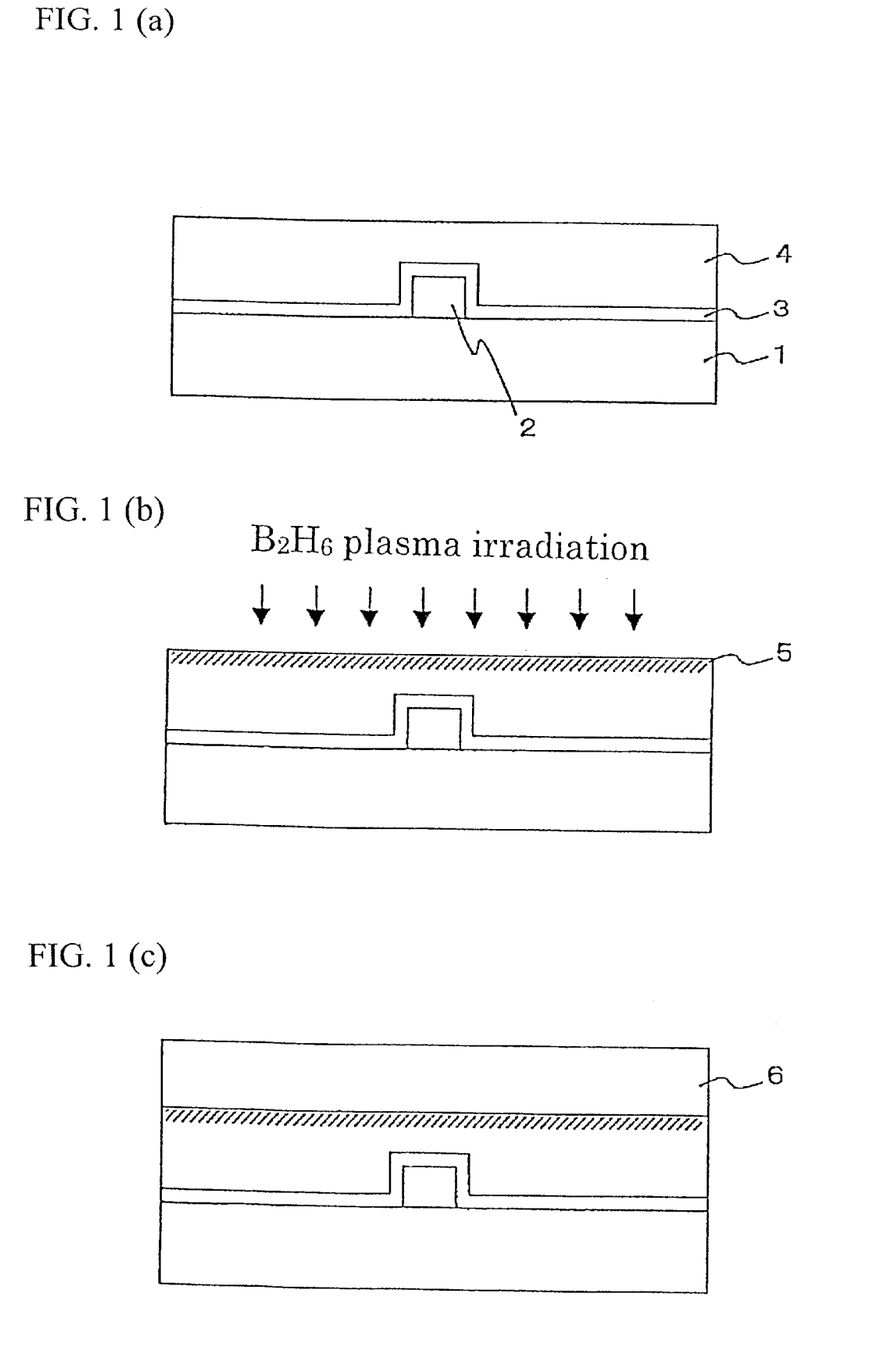
FIGS. 1(a)–1(c) illustrate the first part of a process cross-section showing a process for manufacturing a semiconductor device according to this invention.

An interconnection layer was formed as shown in FIG. 1(a). First, on a semiconductor substrate was formed a silicon oxide film 1, on which was then formed an Al interconnection 2. Over the whole surface was formed a plasma TEOS oxide film 3 (thickness: 100 nm). Then, an HSQ film material was applied to a thickness of about 500 nm, which is that in the maximum film thickness area. After applying the HSQ film material, the product was heated on a hot plate sequentially at 150° C., 250° C. and then 350° C. Heating duration at each temperature was 1 min. Then, the product was heated at 400° C. for 1 hour in an atmosphere of nitrogen to form an HSQ film 4 (FIG. 1(a)).

The substrate having the HSQ film 4 was placed in a parallel-plate type of plasma generator, and then exposed to $B_2H_6$ plasma. Thus, a boron-implanted region 5 was formed in the surface of the HSQ film 4 (FIG. 1(b)). The apparatus was a dual frequency type (13.56 MHz and 400 kHz) of plasma CVD apparatus. A $B_2H_6$ gas pressure was controlled to 0.1 to 2 Torr at a substrate temperature of 400° C. to discharge plasma. Inert gases such as He and Ar were simultaneously introduced for more stable plasma. It has been found in a preliminary experiment that under these plasma conditions, boron is present in a level of several % in the region to 30 nm from the surface of the HSQ film 4. Although $B_2H_6$ gas was used in this example, a boron-containing gas such as $B_4H_{10}$ and $BF_3$ may be used.

Then, over the whole surface was formed a plasma TEOS oxide film 6 (thickness: 200 nm) FIG. 1(c)), on which was then a mask 7 having an opening. Using the mask, the product was subject to wet-etching with buffered hydrofluoric acid to form a sectionally cup-shaped concave 8 in the plasma TEOS oxide film 7 (FIG. 2(a)). In this step, in the prior art, the base HSQ film 4 whose etching rate was higher than that of the plasma TEOS oxide film 7 was etched to form a cavity 15 as shown in FIG. 4(b). In contrast, in this example, the surface of the HSQ film 4 was modified by boron implantation to improve its resistance to buffered hydrofluoric acid, and therefore, cavity formation as above described was effectively prevented.

Figure 2:
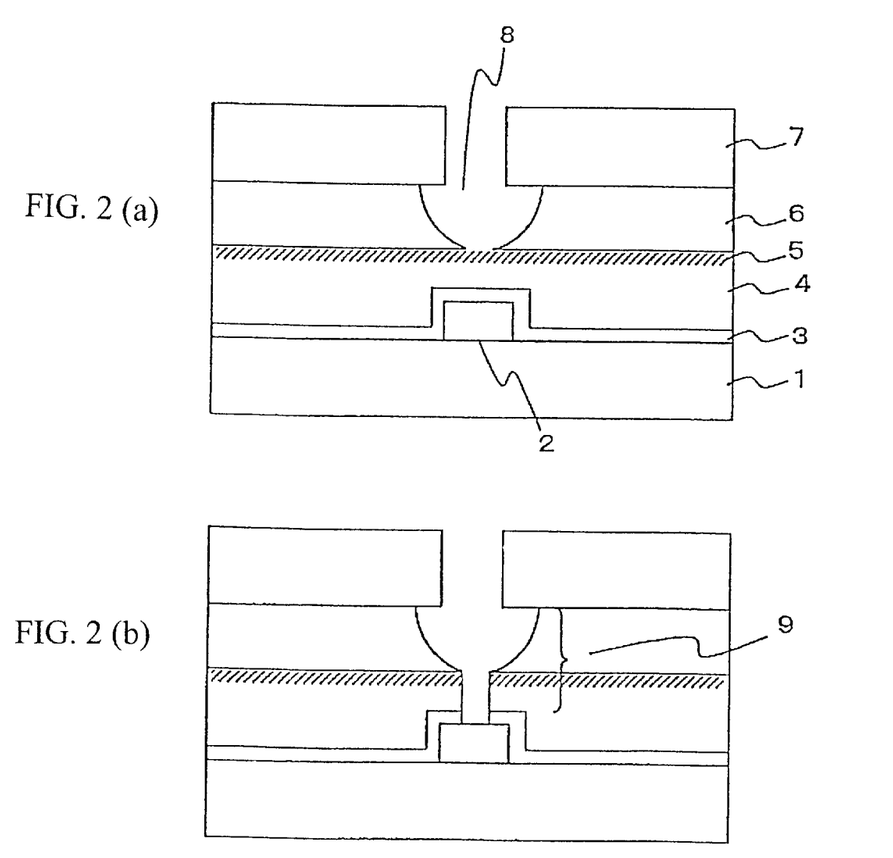
FIGS. 2(a)–2(b) illustrate the second part of the process cross-section showing another process for manufacturing a semiconductor device according to this invention.

Then, leaving the mask 7, the HSQ film 4 exposed in the bottom face of the concave 8 was dry-etched to form a contact hole 9 in the interlayer insulating film (FIG. 2(b)).

In the contact hole thus formed was spattered Ti as a wetting layer to 100 nm and then was filled an Al film. Specifically, an aluminum base film was formed by low-temperature spattering at 150° C., and uninterruptedly an Al film 10 was formed by a high-temperature spattering at 400° C. in vacuo to fill the contact hole (FIG. 3). Then, the filled Al film 10 was subject to reflow at 450° C. and then the film was patterned into a predetermined shape to form an upper interconnection.

A cross-section of the multilayered interconnection structure thus provided was observed with a scanning electron microscope. It was found that the contact hole was formed in a designed shape, its upper part had a cup shape, and there were formed no voids in the contact hole.

Although there has been described a configuration comprising an HSQ film 4 in this example, it will be, of course, understood that an SOG film in place of an HSQ film may be similarly effective.

EXAMPLE 2

A semiconductor device was fabricated as described in Example 1, except that boron was implanted by ion implantation instead of plasma irradiation and an acceleration voltage for boron was 10 keV and a dosage was $1\times10^{15}$ $cm^{-2}$.

A cross-section of the multilayered interconnection structure thus provided was observed with a scanning electron microscope. It was found that the contact hole was formed in a designed shape, its upper part had a cup shape, and there were formed no voids in the contact hole.

This application is based on Japanese patent application NO. HEI10-374172, the content of which is incorporated hereinto by reference.

What is claimed is:

1. A process for manufacturing a semiconductor device, comprising the steps of forming the first and the second films on a semiconductor substrate and then wet-etching the second film with an etchant wherein the first film has a higher etching rate to the etchant than that of the second film; after forming the first film, boron being ion implanted in a surface layer in a level of $5\times10^{21}$ to $1\times10^{23}$ atoms/$cm^3$ to improve said first film's wet etching resistance without changing the film's internal structure, before forming the second film.

2. A process for manufacturing a semiconductor device as claimed in claim 1 where both the first and the second films are a silicon oxide based insulating film.

3. A process for manufacturing a semiconductor device as claimed in claim 1 where the first and the second films are an HSQ (Hydrogen Silisesquioxane) film and a silicon oxide film, respectively.

4. A process for manufacturing a semiconductor device as claimed in claim 1 where the first and the second films are an SOG (Spin On Glass) film and a silicon oxide film, respectively.

5. A process for manufacturing a semiconductor device as claimed in claim 1 where the etchant is a hydrofluoric acid-containing etchant.

6. A process for manufacturing a semiconductor device as claimed in claim 1 where boron is implanted by exposing the first film to boron plasma.

7. A process for manufacturing a semiconductor device as claimed in claim 1 where boron is implanted by ion implantation to the first film.

8. A process for manufacturing a semiconductor device as claimed in claim 1 where boron is implanted such that a boron-containing layer 3 to 100 nm in thickness is formed in the surface of the first film.

9. A process for manufacturing a semiconductor device, comprising the steps of:

forming a lower interconnection on a semiconductor substrate;

forming an interlayer insulating film in which the first and second films are sequentially deposited, on the surface;

wet-etching a given area of the second film with an etchant to expose the first film; dry etching the exposed first film to form a contact hole reaching the lower interconnection; and forming an upper interconnection layer which fills the contact hole;

wherein the first film has a higher etching rate to the wet etchant than that of the second film, after forming the first film, boron being ion implanted in a surface layer in a level of $5\times10^{21}$ to $1\times10^{23}$ atoms/$cm^3$ to improve said first film's wet etching resistance without changing the film's internal structure, before forming the second film.

10. A process for manufacturing a semiconductor device as claimed in claim 9 where both the first and the second films are a silicon oxide based insulating film.

11. A process for manufacturing a semiconductor device as claimed in claim 9 where the first and the second films are an HSQ (Hydrogen Silisesquioxane) film and a silicon oxide film, respectively.

12. A process for manufacturing a semiconductor device as claimed in claim 9 where the first and the second films are an SOG (Spin On Glass) film and a silicon oxide film, respectively.

13. A process for manufacturing a semiconductor device as claimed in claim 9 where the etchant is a hydrofluoric acid-containing etchant.

14. A process for manufacturing a semiconductor device as claimed in claim 9 where boron is implanted by exposing the first film to boron plasma.

15. A process for manufacturing a semiconductor device as claimed in claim 9 where boron is implanted by ion implantation to the first film.

16. A process for manufacturing a semiconductor device as claimed in claim 9 where boron is implanted such that a boron-containing layer 3 to 100 nm in thickness is formed in the surface of the first film.

17. A process for manufacturing a semiconductor device comprising the steps of:

forming a lower interconnection on a semiconductor substrate;

forming an interlayer insulating film in which the first and the second films are sequentially deposited, on the surface;

wet-etching a given area of the second film with an etchant to form a sectional cup-shaped concave in the bottom of which the first film is exposed;

dry-etching, the exposed first film to form a contact hole reaching the lower interconnection;

forming an upper interconnection layer which fills the contact hole; and making the upper interconnection reflow by heating, wherein the first film has a higher etching rate to the wet etchant than that of the second film, after forming the first film, boron being ion implanted in a surface layer in a level of $5 \times 10^{21}$ to $1 \times 10^{23}$ atoms/cm$^3$ to improve said first film's wet etching resistance without changing the film's internal structure, before forming the second film.

18. A process for manufacturing a semiconductor device as claimed in claim 17 where both the first and the second films are a silicon oxide based insulating film.

19. A process for manufacturing a semiconductor device as claimed in claim 17 where the first and the second films are an HSQ (Hydrogen Silisesquioxane) film and a silicon oxide film, respectively.

20. A process for manufacturing a semiconductor device as claimed in claim 17 where the first and the second films are an SOG (Spin On Glass) film and a silicon oxide film, respectively.

21. A process for manufacturing a semiconductor device as claimed in claim 17 where the etchant is a hydrofluoric acid-containing etchant.

22. A process for manufacturing a semiconductor device as claimed in claim 17 where boron is implanted by exposing the first film to boron plasma.

23. A process for manufacturing a semiconductor device as claimed in claim 17 where boron is implanted by ion implantation to the first film.

24. A process for manufacturing a semiconductor device as claimed in claim 17 where boron is implanted such that a boron-containing layer 3 to 100 nm in thickness is formed in the surface of the first film.

* * * * *

UNITED STATES PATENT AND TRADEMARK OFFICE
CERTIFICATE OF CORRECTION

PATENT NO.    : 6,319,797 B1
DATED         : November 20, 2001
INVENTOR(S)   : Usami It is certified that error appears in the above-identified patent and that said Letters Patent is hereby corrected as shown below:

Column 11,
Line 7, "sectional" should be -- sectionally --
Line 9, after "dry-etching", delete "," (comma)

Signed and Sealed this

Eighteenth Day of June, 2002

*Attest:*

*Attesting Officer*

JAMES E. ROGAN
*Director of the United States Patent and Trademark Office*